(12) United States Patent

Saint-Laurent et al.

(10) Patent No.: US 9,417,643 B2
(45) Date of Patent: Aug. 16, 2016

(54) VOLTAGE REGULATOR WITH VARIABLE IMPEDANCE ELEMENT

(71) Applicant: QUALCOMM Incorporated, San Diego, CA (US)

(72) Inventors: Martin Saint-Laurent, San Diego, CA (US); Yuhe Wang, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 481 days.

(21) Appl. No.: 13/842,930

(22) Filed: Mar. 15, 2013

(65) Prior Publication Data

US 2014/0266143 A1    Sep. 18, 2014

(51) Int. Cl.
| | |
|---|---|
| G05F 1/46 | (2006.01) |
| G05F 1/59 | (2006.01) |
| H02M 3/157 | (2006.01) |
| G11C 5/14 | (2006.01) |
| H02M 3/156 | (2006.01) |

(52) U.S. Cl.
CPC .............. *G05F 1/468* (2013.01); *G05F 1/462* (2013.01); *G05F 1/465* (2013.01); *G05F 1/59* (2013.01); *G11C 5/141* (2013.01); *G11C 5/147* (2013.01); *G11C 5/148* (2013.01); *H02M 3/157* (2013.01); *H02M 2003/1566* (2013.01)

(58) Field of Classification Search
CPC ......... G05F 1/462; G05F 1/465; G05F 1/468; G05F 1/56; G05F 1/59; H02M 3/1584; H02M 2003/1586
See application file for complete search history.

(56) References Cited

U.S. PATENT DOCUMENTS

| | | | |
|---|---|---|---|
| 5,177,431 A | 1/1993 | Smith et al. | |
| 5,811,861 A | 9/1998 | Nunokawa | |
| 6,163,143 A * | 12/2000 | Shimamori | ................... 323/284 |
| 7,872,454 B2 | 1/2011 | Sutardja | |
| 2004/0027106 A1 | 2/2004 | Martins | |
| 2008/0157745 A1* | 7/2008 | Nakata | .......................... 323/304 |
| 2011/0051479 A1* | 3/2011 | Breen et al. | ................... 363/148 |
| 2012/0005491 A1 | 1/2012 | Bridges | |
| 2012/0086416 A1* | 4/2012 | Kudo et al. | .................... 323/265 |
| 2012/0166839 A1 | 6/2012 | Sodhi et al. | |
| 2012/0254641 A1 | 10/2012 | Rotem et al. | |
| 2013/0047166 A1 | 2/2013 | Penzes et al. | |

FOREIGN PATENT DOCUMENTS

FR            2880445 A1    7/2006

OTHER PUBLICATIONS

International Search Report and Written Opinion for International Application No. PCT/US2014/024678, ISA/EPO, Date of Mailing Jul. 24, 2014, 11 pages.
Okuma, et al., "0.5-V input digital LDO with 98.7% current efficiency and 2.7-μA quiescent current in 65nm CMOS," 2010 IEEE Custom Integrated Circuits Conference (CICC), 2010, pp. 1-4.

* cited by examiner

*Primary Examiner* — Fred E Finch, III
(74) *Attorney, Agent, or Firm* — Toler Law Group, PC (57) ABSTRACT

A method includes receiving, at a voltage regulator, an activity adjustment signal from a digital circuit. The method also includes controlling one or more variable impedance elements of the voltage regulator to modify an output voltage provided to the digital circuit. The output voltage is based at least in part on the activity adjustment signal.

29 Claims, 8 Drawing Sheets

VOLTAGE REGULATOR WITH VARIABLE IMPEDANCE ELEMENT

I. FIELD

The present disclosure is generally related to voltage regulators.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), tablet computers, and paging devices that are small, lightweight, and easily carried by users. Many such computing devices include other devices that are incorporated therein. For example, a wireless telephone can also include a digital still camera, a digital video camera, a digital recorder, and an audio file player. Also, such computing devices can process executable instructions, including software applications, such as a web browser application that can be used to access the Internet and multimedia applications that utilize a still or video camera and provide multimedia playback functionality.

An electronic device (e.g., a wireless device or a computing device) may include circuits (e.g., processors) that are regulated by a voltage regulator. A voltage regulator is conventionally used to regulate a supply voltage and to provide an output voltage to a circuit to enable the circuit to operate at a lower voltage for power saving. A type of voltage regulator is a low-dropout (LDO) voltage regulator. A LDO voltage regulator is conventionally located on a different semiconductor die than a circuit that is regulated by the LDO voltage regulator. When a LDO voltage regulator is located on a different semiconductor die, metal traces and decoupling capacitors connect the LDO voltage regulator to the circuit. The metal traces and the decoupling capacitors reduce available space on a printed circuit board for other components and add costs.

To reduce the use of metal traces and decoupling capacitors, an analog on-chip LDO voltage regulator may be embedded in the same semiconductor die as the circuit. When a circuit increases current consumption during a time period, an output voltage provided to the circuit may experience a voltage drop during the time period. The analog on-chip LDO voltage regulator reacts to the voltage drop by increasing the output voltage. However, before the output voltage increase, the circuit may get slower due to the voltage drop and may require a reduced clock speed to operate correctly. If the clock speed is not reduced, the circuit may fail.

III. SUMMARY

Increasing an output voltage provided to a circuit after the output voltage has experienced a voltage drop due to increased current demand/consumption of the circuit may reduce clock speed of the circuit. Systems and methods described herein may advantageously enable a voltage regulator to project/determine a processing activity level of the circuit during one or more subsequent clock cycles and to modify a voltage regulator impedance and/or an output voltage that is provided to a circuit based on the predicted processing activity level. Modifying the output voltage based on the projected processing activity level may reduce a voltage drop of the output voltage when the circuit increases current consumption due to increased processing activities.

For example, a voltage regulator may be coupled to a digital circuit (e.g., a processor). The voltage regulator and the digital circuit may be embedded in the same semiconductor die. The voltage regulator may be configured to provide an output voltage to the digital circuit and to receive an activity adjustment signal from the digital circuit. The activity adjustment signal may correspond to a projected processing activity level of the digital circuit. For example, the activity adjustment signal may indicate a number of threads running on the digital circuit, a number of instructions to be executed during one or more subsequent clock cycles, a type of instruction to be executed during one or more subsequent clock cycles, an interrupt signal associated with the digital circuit transitioning from a sleep state to a wake-up state, a cache miss event, new data arriving on a bus, or any combination thereof.

The activity adjustment signal may be generated by activity adjustment logic that is located in the digital circuit. The activity adjustment logic may be coupled to individual components (e.g., an interrupt signal, a scheduler, an instruction cache, etc.). The activity adjustment logic may be configured to retrieve one or more statuses (e.g., an interrupt signal, a cache miss event, etc.) and/or information (e.g., a type of instruction, a number of threads running on a processor, etc.) related to the individual components. The activity adjustment logic may transmit the one or more statuses and/or the information as the activity adjustment signal.

In response to the activity adjustment signal, the voltage regulator may modify (e.g., increase) the output voltage via control logic. For example, the control logic may examine the activity adjustment signal to project/determine a processing activity level of the digital circuit. Based on the projected processing activity level, the control logic may control one or more variable impedance elements of the voltage regulator to modify the output voltage.

In a particular embodiment, the voltage regulator is a digital low drop-out (LDO) voltage regulator and the one or more variable impedance elements include one or more transistors. The control logic may vary a combined resistance of the one or more transistors by controlling gate voltages of the one or more transistors based on the activity adjustment signal. For example, when the control logic determines that the digital logic is likely to operate at a first processing activity level during one or more subsequent clock cycles, the control logic may turn on a single transistor and an output voltage having a first value is generated. When the control logic determines that the digital logic is likely to operate at a second processing activity level, the digital control may turn on two transistors and the output voltage may have a second value. The second value may be greater than the first value.

In another particular embodiment, the voltage regulator is a switch mode power supply and the one or more variable impedance elements include one or more transistors that are coupled to one or more passive elements. The passive elements may include capacitors, inductors, or any combination thereof. The control logic may vary one or more phases of current that drives the one or more passive elements by controlling duty cycles of the one or more transistors based on the activity adjustment signal. For example, when the control logic determines that the digital logic is likely to operate at the first processing activity level, the control logic may turn on a single transistor and turn off a single complementary transistor using a particular duty cycle to enable current to drive an inductor to generate the output voltage. The output voltage may have the first value. When the control logic determines that the digital logic is likely to operate at the second processing activity level, the digital control may turn on two transistors and turn off two complementary transistors using another particular duty cycle to generate the output voltage. The output voltage may have a second value.

In a particular embodiment, the voltage regulator may include one or more analog variable impedance elements that are controlled by an output of a voltage comparator. The output voltage may be a sum of a first output voltage generated by the one or more digital variable impedance elements and a second output voltage generated by the one or more analog variable impedance elements.

In a particular embodiment, an integrated circuit includes a voltage regulator. The voltage regulator includes one or more variable impedance elements and control logic. The control logic is responsive to an activity adjustment signal from a digital circuit. The control logic is configured to control the one or more variable impedance elements such that the voltage regulator provides an output voltage that is based at least in part on the activity adjustment signal.

In another particular embodiment, a method includes receiving, at a voltage regulator, an activity adjustment signal from a digital circuit. The method also includes controlling one or more variable impedance elements of the voltage regulator to modify an output voltage provided to the digital circuit. The output voltage is based at least in part on the activity adjustment signal.

In another particular embodiment, an apparatus includes means for receiving, at a voltage regulator, an activity adjustment signal from a digital circuit. The apparatus also includes means for controlling one or more variable impedance elements of the voltage regulator to modify an output voltage provided to the digital circuit. The output voltage is based at least in part on the activity adjustment signal.

In another particular embodiment, a non-transitory computer-readable storage medium stores instructions executable by a computer to perform operations that include receiving, at a voltage regulator, an activity adjustment signal from a digital circuit. The operations also include controlling one or more variable impedance elements of the voltage regulator to modify an output voltage provided to the digital circuit. The output voltage is based at least in part on the activity adjustment signal.

One particular advantage provided by at least one of the disclosed embodiments is an ability to modify an output voltage that is provided to a digital circuit based on a projected processing activity level of the digital circuit. Other aspects, advantages, and features of the present disclosure will become apparent after review of the entire application, including the following sections: Brief Description of the Drawings, Detailed Description, and the Claims.

V. DETAILED DESCRIPTION

Figure 1:
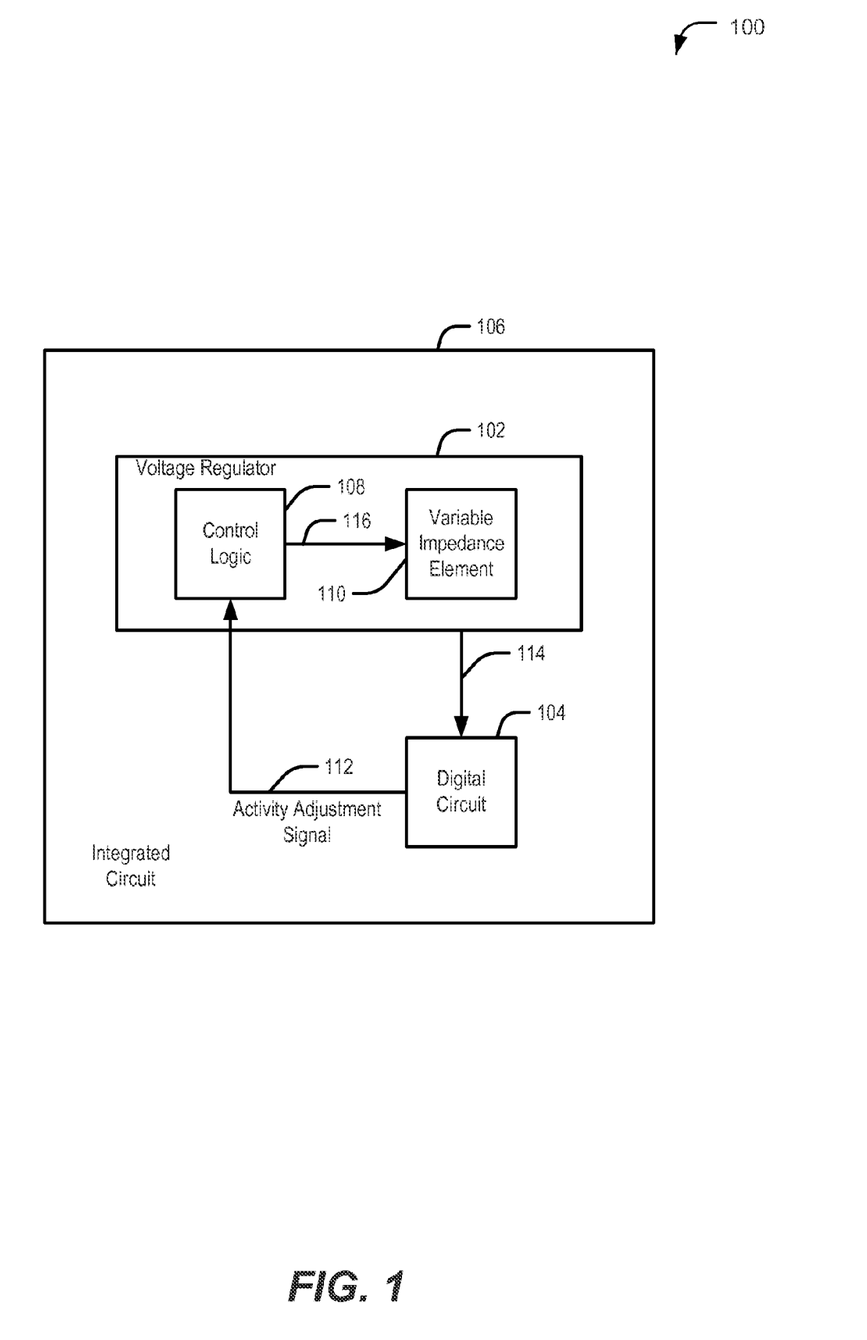
FIG. 1 is a diagram that illustrates a particular embodiment of a system that is operable to modify an output voltage based on a projected processing activity level of a digital circuit.

FIG. 1 is illustrates a particular embodiment of a system 100 that is operable to modify an output voltage based on a projected processing activity level of a digital circuit. The system 100 includes a voltage regulator 102 and a digital circuit 104. The voltage regulator 102 and the digital circuit 104 may be embedded in an integrated circuit 106 (e.g., a semiconductor die). In a particular embodiment, the digital circuit 104 includes a processor. In a particular embodiment, the voltage regulator 102 is a digital low dropout (LDO) voltage regulator. The voltage regulator 102 may include control logic 108 and a variable impedance element 110. The voltage regulator 102 is configured to provide an output voltage 114 to the digital circuit 104. The control logic 108 is configured to adjust the output voltage 114 via the variable impedance element 110.

During operation, the voltage regulator 102 may provide an output voltage 114 at a particular voltage level to the digital circuit 104. The digital circuit 104 may transmit an activity adjustment signal 112 to the control logic 108. The activity adjustment signal 112 may indicate a predicted increase in current demand of the digital circuit 104. The control logic 108 may be a digital circuit that is configured to control other circuits via digital signals. The activity adjustment signal 112 indicates, or can be used to determine, a projection (e.g., prediction) of processing activity level of the digital circuit 104 during a future time period (e.g., during one or more subsequent clock cycles of a processor). For example, the activity adjustment signal 112 may indicate a number of threads running on the digital circuit 104 during one or more subsequent clock cycles, a number of instructions to be executed during one or more subsequent clock cycles, a type of instruction (e.g., a set instruction, a move instruction, a write instruction, etc.) to be executed during one or more subsequent clock cycles, an interrupt signal associated with the digital circuit 104 transitioning from a sleep state to a wake-up state, a receipt of an interrupt associated with the digital circuit 104 transitioning from a sleep state to a wake-up state, a cache miss event, arrival of data from a bus, or any combination thereof. The digital circuit 104 may generate the activity adjustment signal 112 by gathering information regarding processing activity of one or more components of the digital circuit 104. Activity adjustment logic that gathers such information is further described with reference to FIG. 5.

The control logic 108 may examine the activity adjustment signal 112 to predict a processing activity level of the digital circuit 104. For example, the control logic 108 may determine whether the digital circuit 104 is likely to increase current consumption during one or more subsequent clock cycles based on the activity adjustment signal 112. When the control logic 108 determines that the digital circuit 104 is likely to increase current consumption during one or more subsequent clock cycles, the control logic 108 may adjust the variable impedance element 110 to modify (e.g., increase) the output voltage 114. For example, the control logic 108 may adjust the variable impedance element 110 using a digital activity adjustment signal 116. The control logic 108 may increase the output voltage 114 in anticipation of an increase in current consumption by the digital circuit 104.

When the digital circuit 104 increases current consumption during one or more subsequent clock cycles, the modified (e.g., increased) output voltage 114 experiences a voltage drop due to the increased current consumption. However, instead of dropping to a voltage level that is less than a previous voltage level (e.g., prior to the control logic 108 modifying the output voltage 114), the output voltage 114 is substantially maintained at the previous voltage level. Accordingly, the digital circuit 104 may operate at a voltage level that is substantially equal to the previous voltage level during a period of increased current consumption. Thus, the digital circuit 104 does not operate at a reduced clock speed due to a voltage level drop of the output voltage 114 during the period of increased current consumption.

In a particular embodiment, the control logic 108 increases the output voltage 114 by a fixed amount in response to a determination that there is an expected increase in current consumption during one or more subsequent clock cycles. In another particular embodiment, the control logic 108 increases the output voltage 114 by an incremental amount based on a particular processing activity level. The control logic 108 may use a lookup table stored in the control logic 108 to determine the amount of voltage level increase. For example, when the control logic 108 determines that the digital circuit 104 is likely to operate at a first processing activity level during one or more subsequent clock cycles, the control logic 108 may increase the output voltage 114 by a first amount (e.g., 0.1 volts). When the control logic 108 determines that the digital circuit 104 is likely to operate at a second processing activity level during one or more subsequent clock cycles, the control logic 108 may increase the output voltage 114 by a second amount (e.g., 0.2 volts).

The control logic 108 may sample the activity adjustment signal 112 periodically (e.g., according to a voltage regulator clock signal). The voltage regulator clock signal may be generated from a digital circuit clock signal of the digital circuit 104. In a particular embodiment, the voltage regulator clock signal has the same frequency as the clock signal of the digital circuit 104. In another particular embodiment, the voltage regulator clock has a different frequency than the digital circuit clock signal. In another embodiment, the voltage regulator clock signal may be a phase shifted version of the digital circuit clock signal. In a particular embodiment, rising edges of the digital clock signal are used as the voltage regulator clock signal. In another particular embodiment, falling edges of the digital circuit clock signal are used as the voltage regulator clock signal.

The system 100 may thus enable a voltage regulator to modify an output voltage that is provided to a digital circuit based on a projected processing activity level of the digital circuit. Modifying the output voltage based on the projected processing activity level may reduce a voltage drop of the output voltage when the digital circuit increases current consumption due to increased processing activities, thereby enabling the digital circuit to operate at a consistent clock speed.

Figure 2:
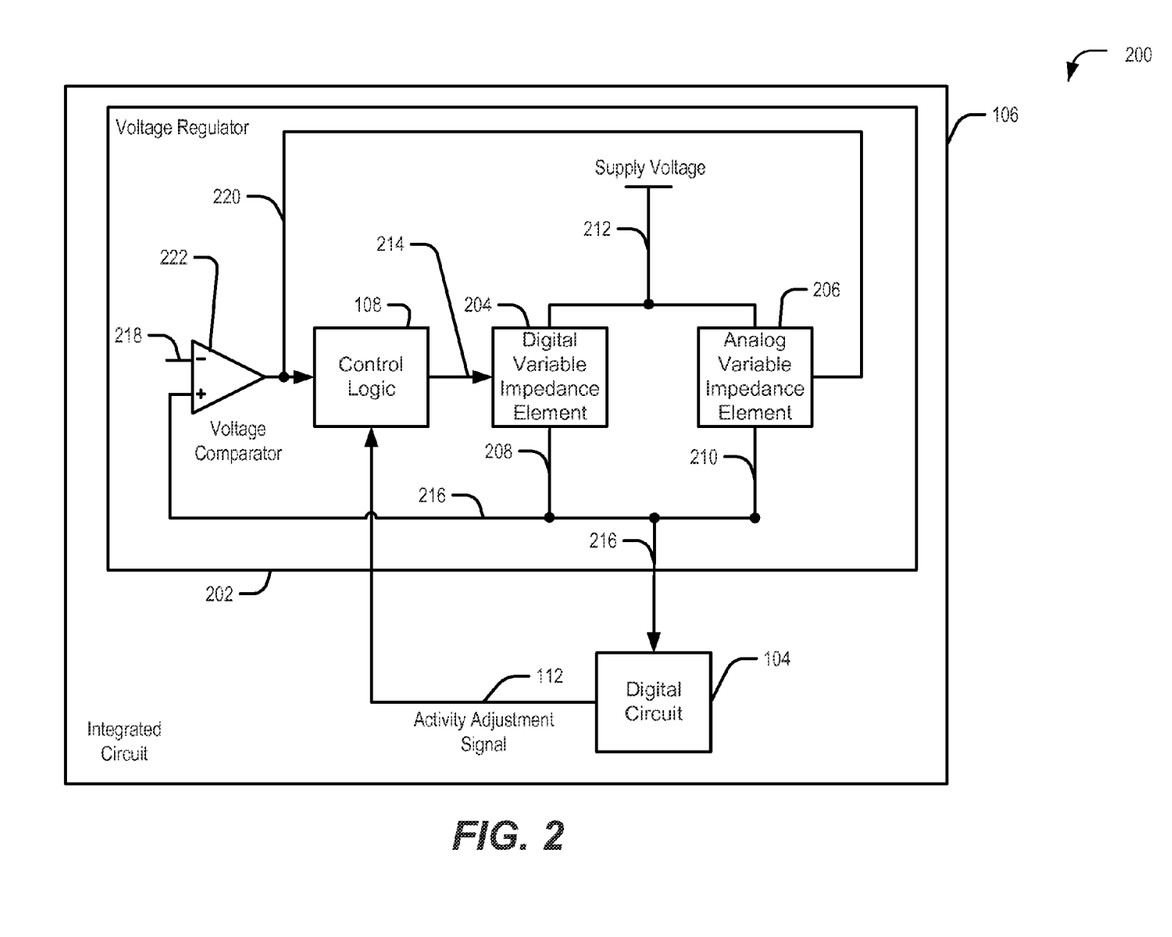
FIG. 2 is a diagram that illustrates another particular embodiment of a system that is operable to modify an output voltage based on a projected processing activity level of a digital circuit.

FIG. 2 is a diagram that illustrates another particular embodiment of a system 200 that is operable to modify an output voltage based on a projected processing activity level of a digital circuit. The system 200 includes a voltage regulator 202 and the digital circuit 104. The voltage regulator 202 and the digital circuit 104 may be embedded in the integrated circuit 106. The voltage regulator 202 may include a digital variable impedance element 204, an analog variable impedance element 206, a voltage comparator 222, and the control logic 108.

The digital variable impedance element 204 and the analog variable impedance element 206 may receive a supply voltage 212. The control logic 108 may adjust the digital variable impedance element 204 to generate a first output voltage 208 based on the supply voltage 212. The voltage comparator 222 may adjust the analog variable impedance element 206 to generate a second output voltage 210 based on the supply voltage 212. The first output voltage 208 and the second output voltage 210 may form a basis (e.g., may be summed) for an output voltage 216 that is provided to the digital circuit 104. The output voltage 216 is also provided to the voltage comparator 222.

During operation, the voltage comparator 222 may compare the output voltage 216 to a reference voltage 218 to determine an amount of voltage adjustment to be applied to the analog variable impedance element 206. The voltage comparator 222 may adjust the analog variable impedance element 206 via an analog voltage adjustment signal 220. In response to the analog voltage adjustment signal 220, the analog variable impedance element 206 may adjust a voltage level of the second output voltage 210. The voltage comparator 222 may also provide the analog voltage adjustment signal 220 to the control logic 108. The analog adjustment signal 220 may be an output (e.g., a voltage signal) of the voltage comparator 222. The control logic 108 may determine an amount of voltage adjustment for the digital variable impedance element 204 based on the analog voltage adjustment signal 220 and the activity adjustment signal 112. The control logic 108 may adjust the digital variable impedance element 204 via a digital voltage adjustment signal 214. In response to the digital voltage adjustment signal 214, the digital variable impedance element 204 may adjust a voltage level of the first output voltage 208 in a similar manner as described with reference to FIG. 1.

Figure 3:
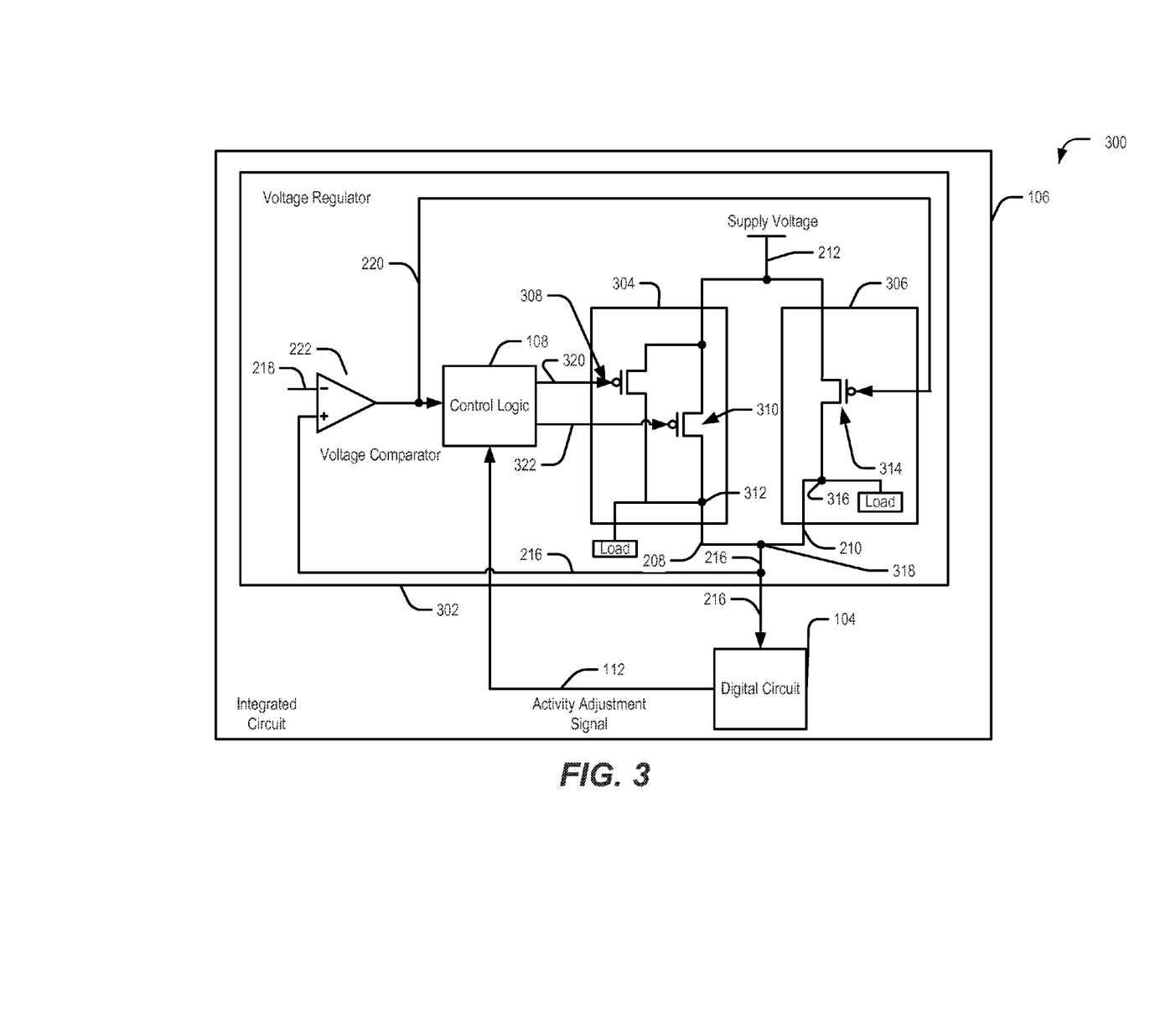
FIG. 3 is a diagram that illustrates another particular embodiment of a system that is operable to modify an output voltage based on a projected processing activity level of a digital circuit.

FIG. 3 is a diagram that illustrates another particular embodiment of a system 300 that is operable to modify an output voltage based on a projected processing activity level of a digital circuit. The system 300 includes a voltage regulator 302 and the digital circuit 104. The voltage regulator 302 and the digital circuit 104 may be embedded in the integrated circuit 106. The voltage regulator 302 may include a digital variable impedance element 304, an analog variable impedance element 306, the voltage comparator 222, and the control logic 108. In a particular embodiment, the voltage regulator 302 is a digital LDO voltage regulator.

The digital variable impedance element 304 may include a first transistor 308 and a second transistor 310. The digital variable impedance element 304 may be coupled to the supply voltage 212 and configured to generate the first output voltage 208 at a node 312. The first transistor 308 and the second transistor 310 may be connected in a parallel configuration to generate the first output voltage 208 at the first node 312. Although two transistors are illustrated, it should be understood that the digital variable impedance element 304 may include any number of transistors.

The analog variable impedance element 306 may include a third transistor 314. The analog variable impedance element 306 may be coupled to the supply voltage 212 and configured to generate the second output voltage 210 at a second node 316. The first output voltage 208 and the second output voltage 210 may be summed at a third node 318 to produce the output voltage 216 that is provided to the digital circuit 104 and to the comparator 222. In a particular embodiment, the transistors 308, 310, 314 are passive p-type metal-oxide semiconductor field-effect transistors (pMOSFETs). In a particular embodiment, the transistors 308, 310, 314 are p-type FinFETs.

During operation, the control logic 108 may modify the first output voltage 208 by controlling respective gate voltages of the first transistor 308 and the second transistor 310. When the first transistor 308 and/or the second transistor 310 operate in the linear region, each of the transistors 308, 310 may have a respective internal resistance that can be controlled based on the respective gate voltage. Accordingly, by controlling the respective gate voltages of the first transistor 308 and the second transistor 310, the first output voltage 208 may be modified. In a particular embodiment, the first transistor 308 has a different internal resistance than the second transistor 310. The different internal resistances may be implemented using different threshold voltages, channel lengths, or stacking.

The control logic 108 may control the respective gate voltages of the first transistor 308 and the second transistor 310 based on the activity adjustment signal 112. For example, when the control logic 108 determines that the digital circuit 104 is not likely to increase current consumption during one or more subsequent clock cycles based on the activity adjustment signal 112 (e.g., the activity adjustment signal 112 has a low value), the control logic 108 may turn off the first transistor 308 and the second transistor 310 via individual digital adjustment signals 320, 322 (e.g., voltage signals). For example, the control logic 108 may control the respective gate voltages of the first transistor 308 and the second transistor 310 via the digital adjustment signals 320, 322 such that the respective gate voltages are less than respective threshold voltages of the transistors 308, 310. Accordingly, in this case, the first output voltage 208 is not generated at the node 312. When the control logic 108 determines that the digital circuit 104 is likely to operate at a first processing activity level (based on a value of the activity adjustment signal 112), the control logic 108 may turn on the first transistor 308 via the digital adjustment signal 320 (e.g., a voltage signal having a first voltage value), but may leave the second transistor 310 off. For example, the control logic 108 may control a gate voltage of the first transistor 308 such that the first transistor 308 operates in the linear region. In this case, the first output voltage 208 having a first value is generated at the node 312. When the control logic 108 determines that the digital circuit 104 is likely to operate at a second processing activity level (based on a value of the activity adjustment signal 112), the control logic 108 may turn on both of the transistors 308, 310 via the digital adjustment signals 320, 322. For example, the control logic 108 may control the respective gate voltages of the transistors 308, 310 such that the transistors 308, 310 both operate in the linear region. In this case, the first output voltage 208 having a second value is generated at the node 312. The second value is greater than the first value. The voltage comparator 222 may control a gate voltage of the third transistor 314 via the analog voltage adjustment signal 220 to generate the second output voltage 210 in a similar manner as described with reference to FIG. 2. In a particular embodiment, the digital variable impedance element 304 and/or the analog variable impedance element 306 includes variable resistors instead of the transistors 308, 310, 314.

Figure 4:
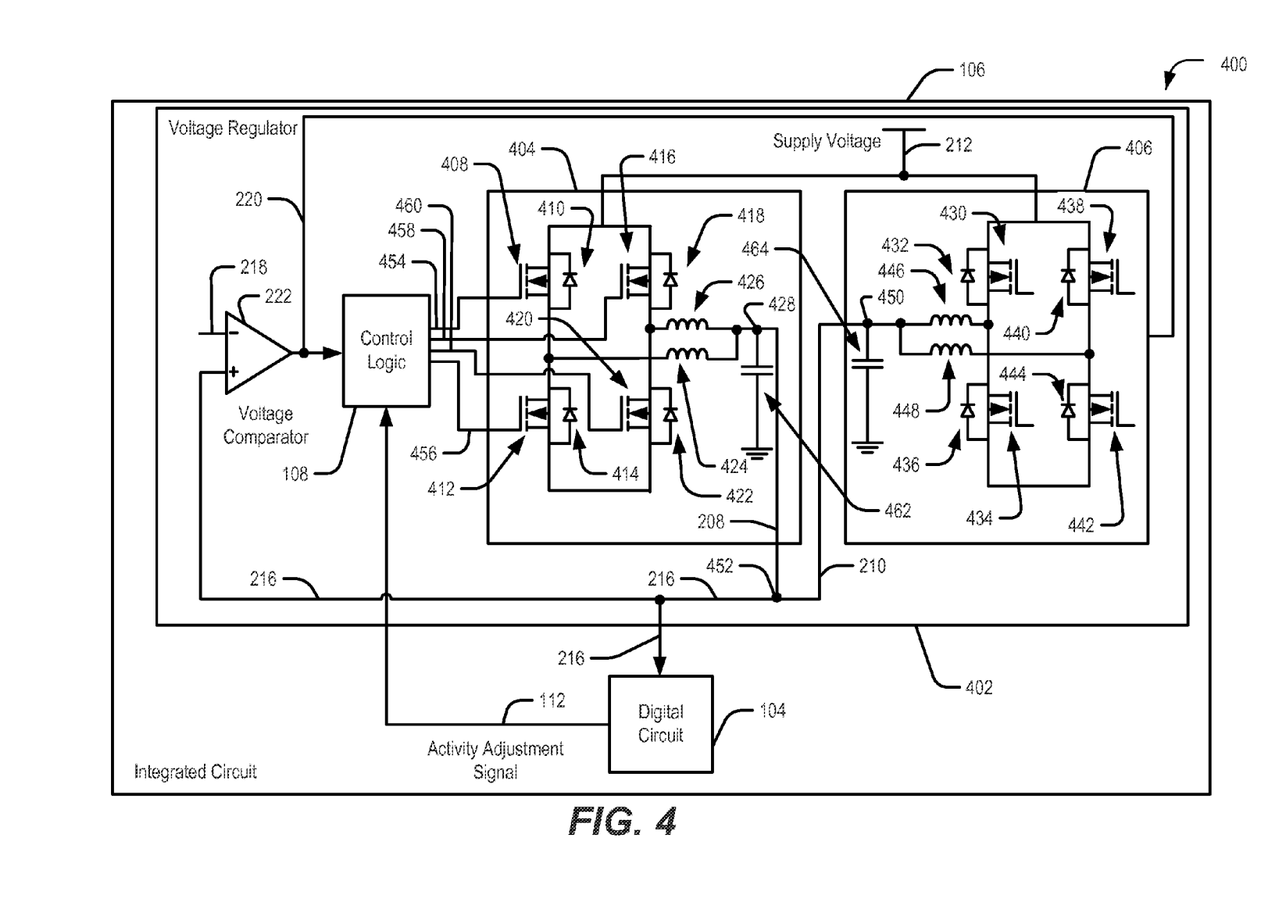
FIG. 4 is a diagram that illustrates another particular embodiment of a system that is operable to modify an output voltage based on a projected processing activity level of a digital circuit.

FIG. 4 is a diagram that illustrates another particular embodiment of a system that is operable to modify an output voltage based on a projected processing activity level of a digital circuit. The system 400 includes the voltage regulator 402 and the digital circuit 104. The voltage regulator 402 and the digital circuit 104 may be embedded in the integrated circuit 106. The voltage regulator 402 may include a digital variable impedance element 404, an analog variable impedance element 406, the voltage comparator 222, and the control logic 108. In a particular embodiment, the voltage regulator 402 is a switch mode power supply.

The digital variable impedance element 404 may include a first transistor 408, a second transistor 412, a third transistor 416, and a fourth transistor 420. The digital variable impedance element 404 may be coupled to the supply voltage 212 and configured to generate the first output voltage 208 at a node 428. Each of the transistors 408, 412, 416, 420 may be coupled to corresponding diodes 410, 414, 418, 422. The first transistor 408, the first diode 410, the second transistor 412, and the second diode 414 may be connected to one or more passive elements, such as a first inductor 424. The third transistor 416, the third diode 418, the fourth transistor 420, and the fourth diode 422 may be connected to one or more passive elements, such as a second inductor 426. The first inductor 424 and the second inductor 426 may be coupled to a first capacitor 462.

The analog variable impedance element 406 may include a fifth transistor 430, a sixth transistor 434, a seventh transistor 438, and an eighth transistor 442. The analog variable impedance element 406 may be connected to the supply voltage 212 and configured to generate the second output voltage 210 at a node 450. The first output voltage 208 and the second output voltage 210 may be summed at a node 452. Each of the transistors 430, 434, 438, 442 may be coupled to corresponding diodes 432, 436, 440, 444. The fifth transistor 430, the fifth diode 432, the sixth transistor 434, and the sixth diode may be coupled to one or more passive elements, such as a third inductor 446. The seventh transistor 438, the seventh diode 440, the eighth transistor 442, and the eighth diode 444 may be coupled to one or more passive elements, such as a fourth inductor 448. The third inductor 446 and the fourth inductor 448 may be coupled to a second capacitor 464.

During operation, the control logic 108 may control the duty cycles of the transistors 408, 412, 416, 420 to control the first output voltage 208. For example, the control logic 108 may selectively turn on or off the transistors 408, 412, 416, 420 via individual digital voltage adjustment signals 454, 456, 458, 460 to control the duty cycles. By controlling the duty cycles of the transistors 408, 412, 416, 420, the control logic 108 may control phases of currents that drive the inductors 424, 426 that generate the first output voltage 208. Accordingly, the control logic 108 may control the first output voltage 208. The first transistor 408 and the second transistor 412 may operate in a complementary manner (e.g., the first transistor 408 is turned on when the second transistor 412 is turned off). The third transistor 416 and the fourth transistor 420 may operate in a complementary manner.

The control logic 108 may vary the duty cycles of the transistors 408, 412, 416, 420 based on the activity adjustment signal 112. For example, when the control logic 108 determines that the digital circuit 104 is not likely to increase current consumption during one or more subsequent clock cycles based on the activity adjustment signal, the control logic 108 may turn off the transistors 408, 416 and may turn on the transistors 412, 420 via the digital adjustment signals 454, 456, 458, 460. In this case, the first output voltage 208 is not generated at the node 428. When the control logic 108 determines (based on the activity adjustment signal 112) that the digital circuit 104 is likely to operate at the first processing activity level, the control logic 108 may turn on the transistor 408 and may turn off the transistor 412. The first output voltage 208 having a first value is generated at the node 428. When the control logic 108 determines (based on the activity adjustment signal 112) that the digital circuit 104 is likely to operate at the second processing activity level, the control logic 108 may also turn on the transistor 416 and may turn off the transistor 420. In this case, the first output voltage 208 having a second value is generated at the node 428. The second value is greater than the first value.

The fifth transistor 430 and the sixth transistor 434 may operate in a complementary manner. The seventh transistor 438 and the eighth transistor 442 may operate in a complementary manner. The voltage comparator 222 generates the analog adjustment signal 220 that controls duty cycles of the transistors 430, 434, 438, 442 to control the second output voltage 210. In response to the analog voltage adjustment signal 220, the transistors 430, 434, 438, 442 may be selectively turned on or off using gating circuits (not shown). By controlling the duty cycles of the transistors 430, 434, 438, 442, the voltage comparator 222 may control phases of currents that drive the inductors 446, 448 to generate the second output voltage 210. Accordingly, the voltage comparator 222 may control the second output voltage 210.

Figure 5:
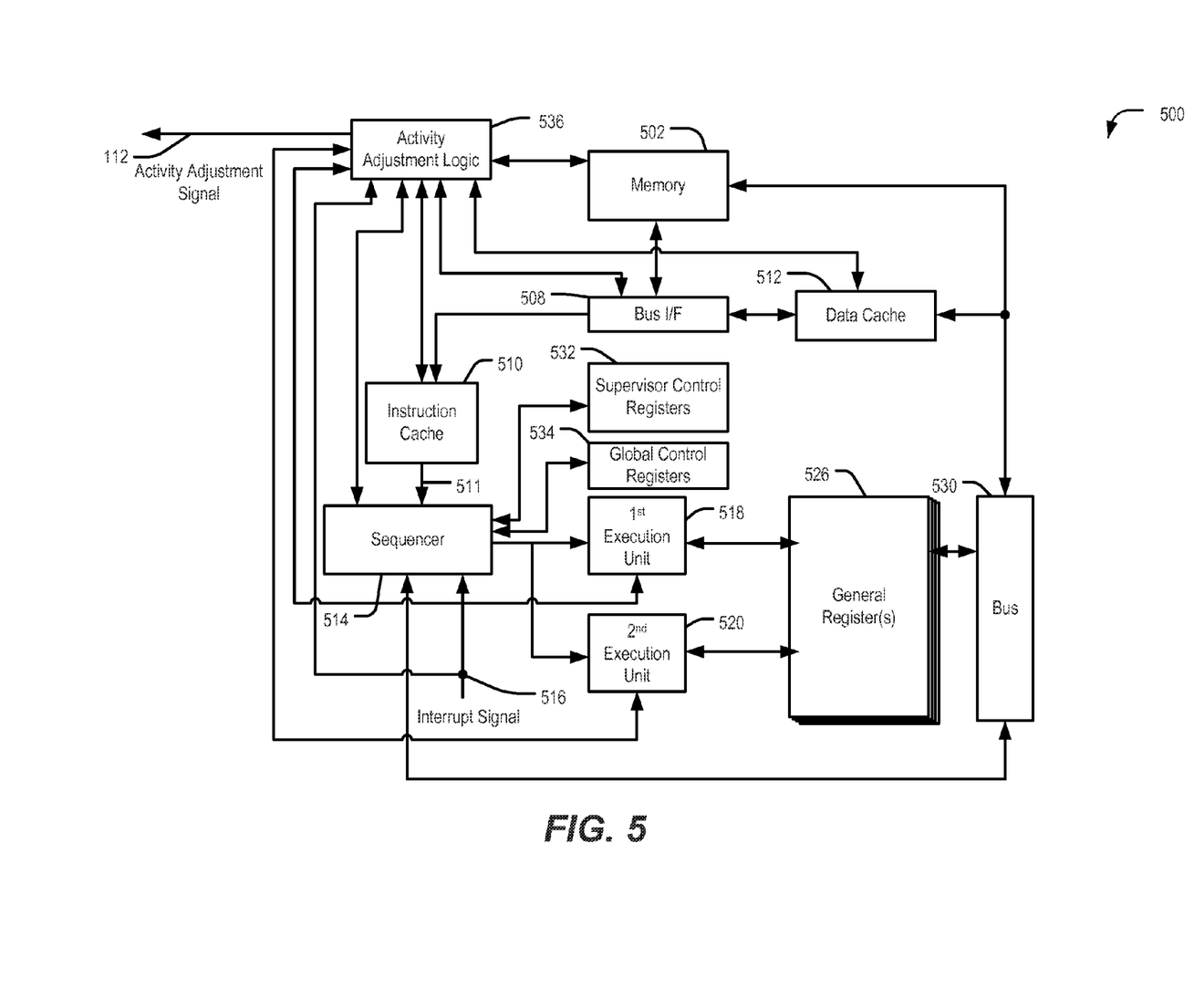
FIG. 5 is a diagram that illustrates a particular embodiment of digital circuit that includes activity adjustment logic.

FIG. 5 is a diagram that illustrates a particular embodiment of digital circuit 500 that includes activity adjustment logic. The digital circuit 500 includes an instruction cache 510, a sequencer 514, a memory 502, a first execution unit 518, a second execution unit 520, activity adjustment logic 536, and a general register(s) (e.g. a register file) 526 as illustrated. In a particular embodiment, the digital circuit 500 is a processor. In another particular embodiment, the digital circuit 500 is a multi-threaded processor. The digital circuit 500 may be the digital circuit 104 of FIGS. 1-4.

The digital circuit 500 further includes a bus interface 508 and a data cache 512. The memory 502 is coupled to the bus interface 508. In addition, the data cache 512 is coupled to the bus interface 508. Data may be provided to the data cache 512 or to the memory 502. The data stored within the data cache 512 may be provided via the bus interface 508 to the memory 502. Thus, the memory 502 may retrieve data from the data cache 512 via the bus interface 508. Additionally, a bus 530 couples the general registers 526, the sequencer 514, the data cache 512 and the memory 502.

The digital circuit 500 further includes supervisor control registers 532 and global control registers 534. The sequencer 514 may be responsive to data stored at the supervisor control registers 532 and the global control registers 534. For example, the supervisor control registers 532 and the global control registers 534 may store bits that may be accessed by control logic within the sequencer 514 to determine whether to accept interrupts, such as an interrupt signal 516, and to control execution of instructions. The interrupt signal 516 may be associated with an interrupt indicating the digital circuit 500 transitioning from a sleep state to a wake-up state. The instruction cache 510 may be coupled to the sequencer 514 via a plurality of current instruction registers (not shown), which may be associated with particular threads of the digital circuit 500. One or more of the memory 502, the general register(s) 526, and the data cache 512 may be shared between multiple requestors, e.g. multiple threads of a multithreaded processor or multiple processors of a multiprocessor system.

The activity adjustment logic 536 may be coupled to individual components of the digital circuit 500 to detect a status of and/or retrieve information related to the individual components. For example, the activity adjustment logic 536 may be coupled to the sequencer 514, the execution units 518, 520, the memory 502, the instruction cache 510, the bus interface 508, the data cache 512, or any combination thereof. The activity adjustment logic 536 may generate the activity adjustment signal 112 based on the detected status and/or retrieved information. The activity adjustment signal 112 may include one or more signals. The activity adjustment logic 536 may also receive the interrupt signal 516. The detected status and/or retrieved information may include a number of threads running on the digital circuit 500, a number of instructions to be executed during one or more subsequent clock cycles, a type of instruction (e.g., a set instruction, a move instruction, a write instruction, etc.) to be executed during one or more subsequent clock cycles, an interrupt signal associated with the digital circuit 500 transitioning from a sleep state to a wake-up state, a cache miss event, arrival of data from a bus, or any combination thereof.

Accordingly, the activity adjustment logic 536 may generate the activity adjustment signal 112 to be used by a voltage regulator (e.g., the voltage regulator 102 of FIG. 1, the voltage regulator 202 of FIG. 2, the voltage regulator 302 of FIG. 3, or the voltage regulator 402 of FIG. 4) to modify an output voltage (e.g., the output voltage 114 of FIG. 1, the first output voltage 208 of FIG. 2, or the output voltage 216 of FIG. 2).

Figure 6:
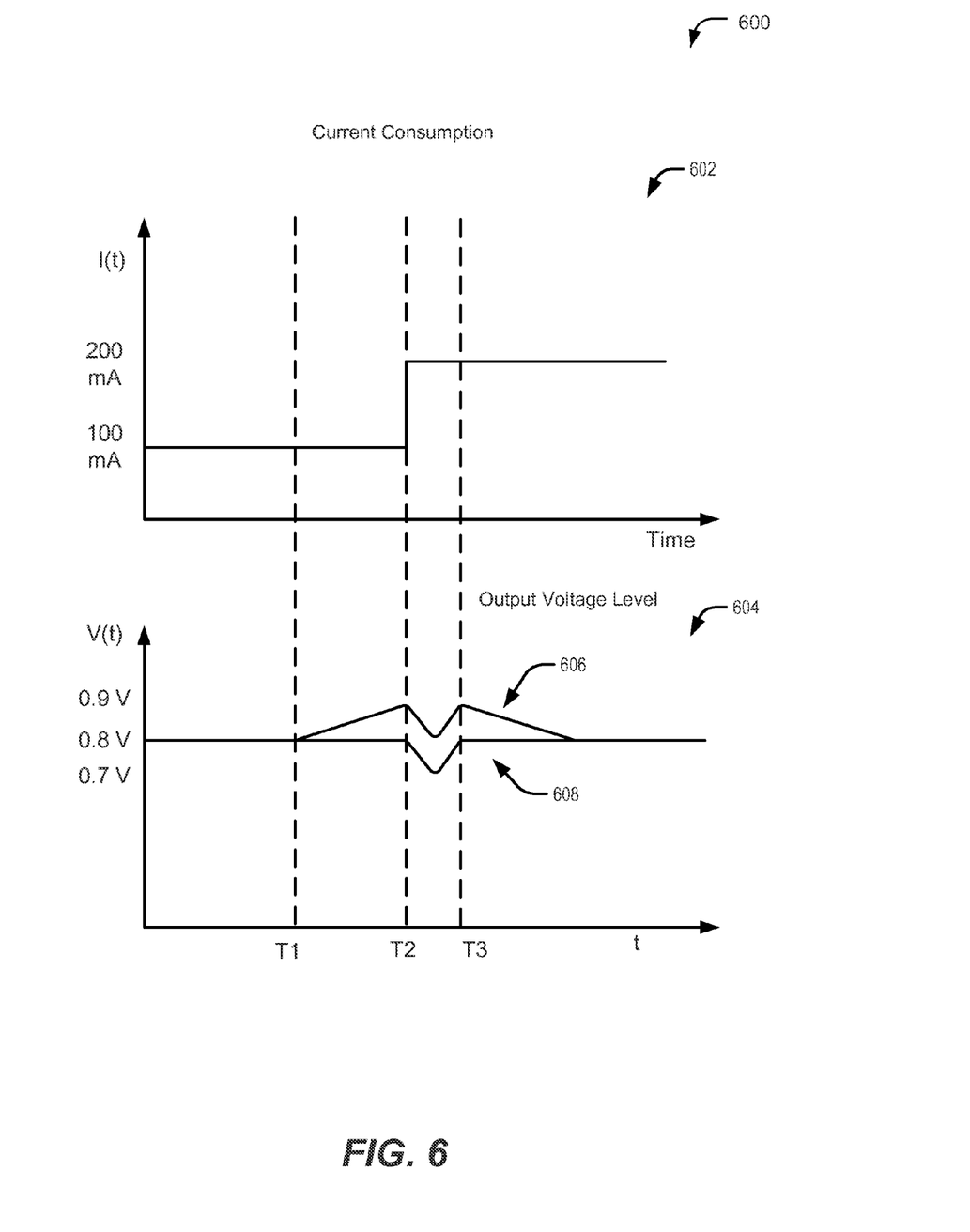
FIG. 6 a diagram that illustrates difference in output voltage drop between a proactive output voltage adjustment based on a projected processing activity level of a digital circuit and a reactive output voltage adjustment that is not based on the projected processing activity level.

FIG. 6 illustrates a particular embodiment of a graph 600 that illustrates a difference in output voltage drop between a proactive output voltage adjustment based on a projected processing activity level of a digital circuit and a reactive output voltage adjustment that is not based on the projected processing activity level. A current consumption graph 602 illustrates an amount of current that a digital circuit (e.g., the digital circuit 104 of FIGS. 1-4 or the digital circuit 500 of FIG. 5) consumes. An output voltage level graph 604 illustrates a voltage level of an output voltage (e.g., the output voltage 114 of FIG. 1 or the output voltage 216 of FIGS. 2-4) that is provided to the digital circuit. In a particular embodiment, the digital circuit consumes 100 milli-amps (mA) of current prior to a time T2 and operates at an output voltage level of 0.8 Volt (V). At the time T2, the digital circuit increases current consumption to 200 mA. Between times T2 and T3, the output voltage experiences a drop of 0.1 V due to the current consumption increase.

When the output voltage is regulated by a conventional voltage regulator (as indicated at 608 in FIG. 6), the output voltage drops to 0.7 V between the times T2 and T3 due to the current consumption increase before being adjusted back to 0.8 V at the time T3. Thus, the digital circuit operates at a reduced clock speed for a period of time between the times T2 to T3 due to the reduced output voltage. When the output voltage is regulated by the voltage regulator 102, the voltage regulator 202, the voltage regulator 302, or the voltage regulator 402 (as indicated at 606 in FIG. 6), the output voltage is increased to 0.9 V at the time T2 in response to a determination/prediction that the digital circuit is likely to increase current consumption during one or more subsequent clock cycles. The prediction is made based on an activity adjustment signal (e.g., the activity adjustment signal 112). At the time T2, the output voltage drops from 0.9 V to a level that is substantially equal to 0.8 V before being adjusted back to 0.9 V at time T3. Thus, the digital circuit does not operate at a reduced clock speed between the times T2 and T3.

Figure 7:
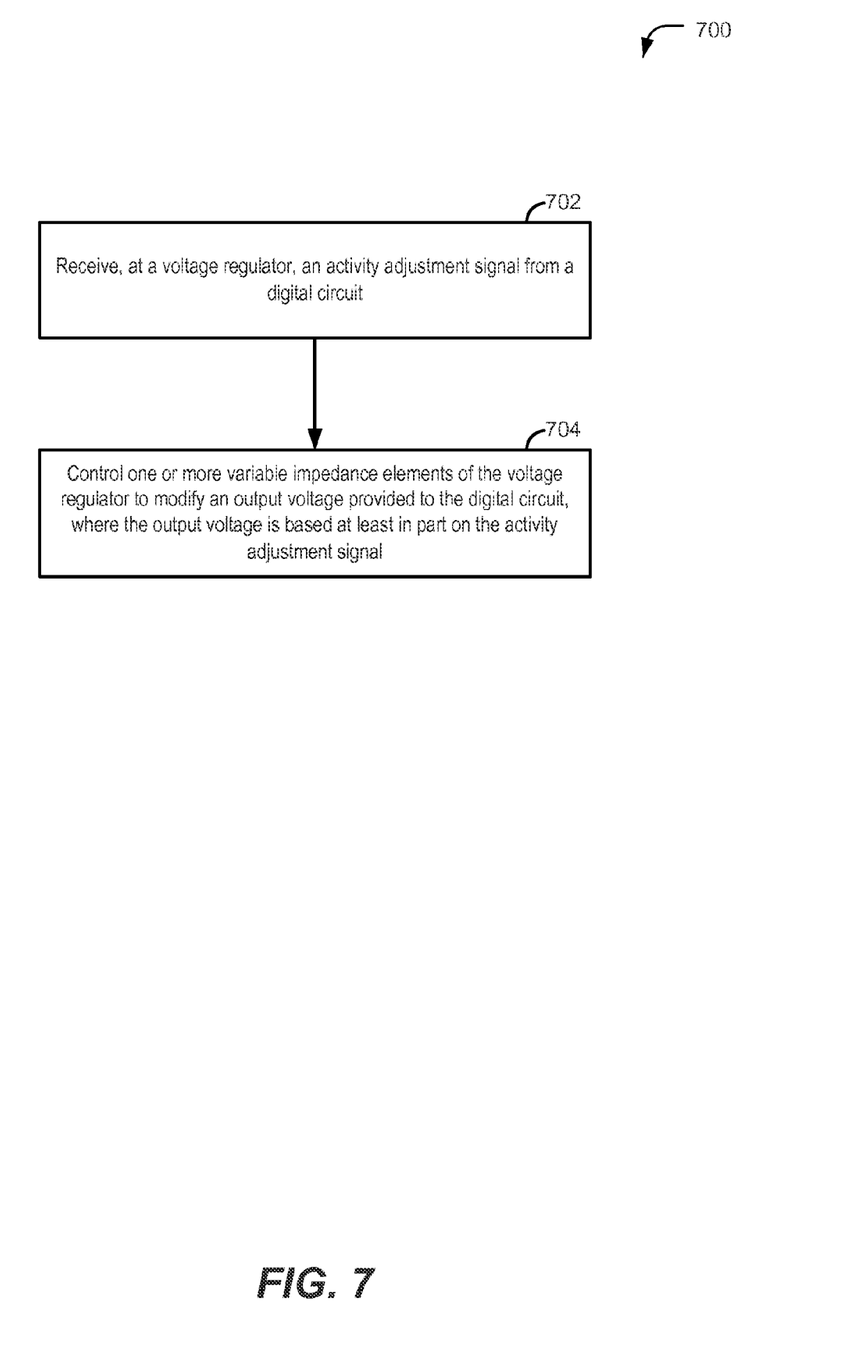
FIG. 7 is a flowchart that illustrates a particular embodiment of a method of operation at a voltage regulator to modify an output voltage based on a projected processing activity level of a digital circuit.

FIG. 7 is a flowchart that illustrates a particular embodiment of a method 700 of operation at a voltage regulator to modify an output voltage based on a projected processing activity level of a digital circuit. The method 700 includes receiving, at a voltage regulator, an activity adjustment signal from a digital circuit, at 702. For example, referring to FIG. 1, the control logic 108 may receive the activity adjustment signal 112 from the digital circuit 104. The method 700 also includes controlling one or more variable impedance elements of the voltage regulator to modify an output voltage provided to the digital circuit, at 704. The output voltage is based at least in part on the activity adjustment signal. For example, referring to FIG. 1, the control logic 108 may determine whether the digital circuit 104 is likely to increase current consumption during one or more subsequent clock cycles based on the activity adjustment signal 112. When the control logic 108 determines that the digital circuit 104 is likely to increase current consumption during one or more subsequent clock cycles, the control logic 108 may adjust the variable impedance element 110 to modify (e.g., increase) the output voltage 114. Thus, the method 700 may enable a voltage regulator to modify an output voltage that is provided to a digital circuit based on a projected processing activity level of the digital circuit.

Figure 8:
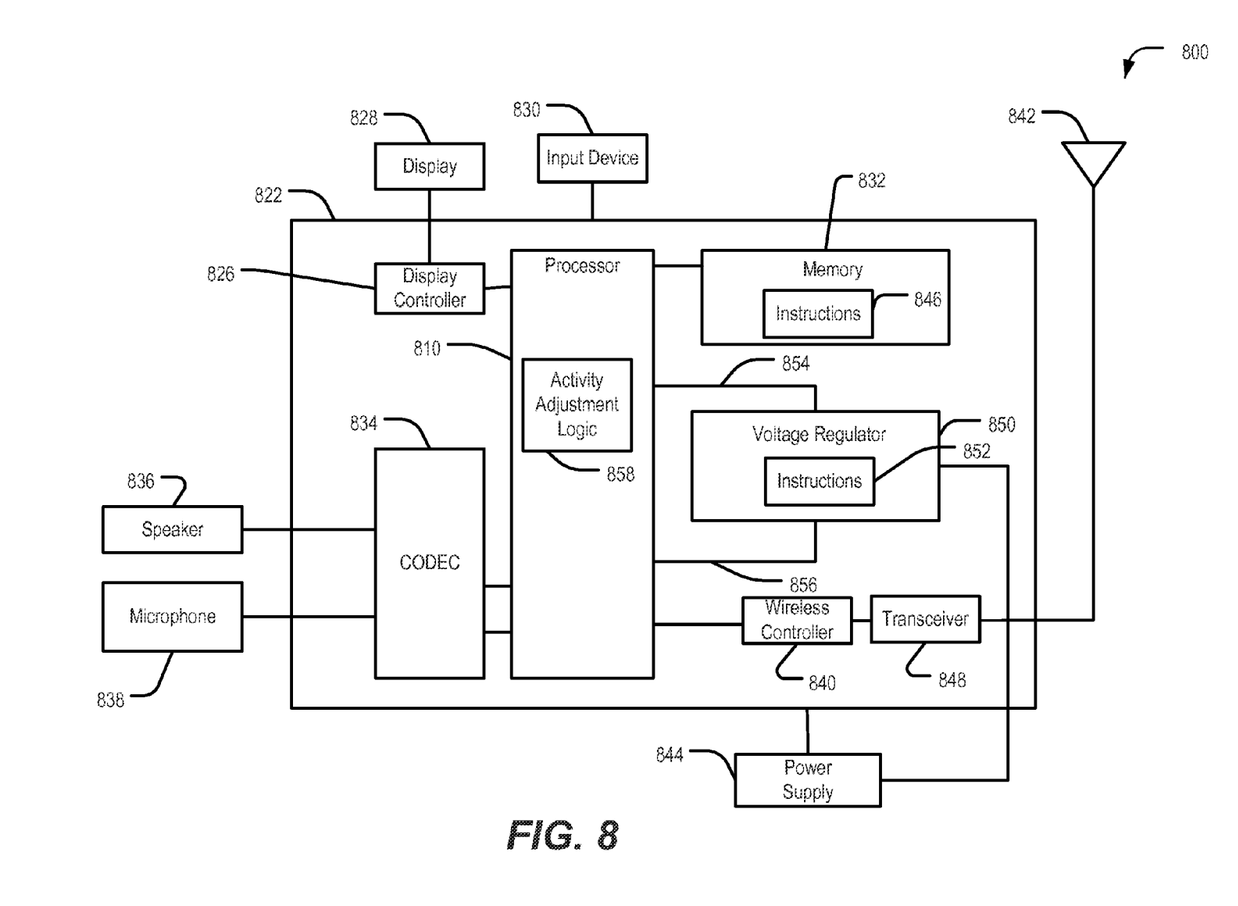
FIG. 8 is diagram that illustrates a particular embodiment of a communication device including components that are operable to modify an output voltage based on a projected processing activity level of a digital circuit.

FIG. 8 illustrates a particular embodiment of a communication device 800 including components that are operable to modify an output voltage based on a projected processing activity level of a digital circuit. In one embodiment, the communication device 800, or components thereof, includes the voltage regulator 102 of FIG. 1, the voltage regulator 202 of FIG. 2, the voltage regulator 302 of FIG. 3, or the voltage regulator 402 of FIG. 4. The communication device 800, or components thereof, may include activity adjustment logic 858. Further, the method described in FIG. 7, or certain portions thereof, may be performed at or by the communication device 800, or components thereof.

The communication device 800 includes a processor 810, such as a digital signal processor (DSP), coupled to a memory 832. The processor 810 may include the activity adjustment logic 858, such as the activity adjustment logic 536 of FIG. 5. The activity adjustment logic 858 may be configured to detect statuses and/or information related to components of the processor 810 (e.g., a number of threads running on the processor 810, a number of instructions to be executed during one or more subsequent clock cycles, a type of instruction to be executed during one or more subsequent clock cycles, an interrupt signal associated with the processor 810 and/or the communication device 800 transitioning from a sleep state to a wake-up state, a cache miss event, arrival of data from a bus, or any combination thereof). The activity adjustment logic 858 may be configured to generate an activity adjustment signal 854, such as the activity adjustment signal 112 of FIGS. 1-5, based on the detected statuses and/or information related to the components of the processor 810. The memory 832 may be a non-transitory tangible computer-readable and/or processor-readable storage device that stores instructions 846. The instructions 846 may be executable by the processor 810 to perform one or more functions.

The communication device 800 may also include a voltage regulator 850 coupled to the processor 810. The voltage regulator 850, such as the voltage regulator 102 of FIG. 1, the voltage regulator 202 of FIG. 2, the voltage regulator 302 of FIG. 3, or the voltage regulator 402 of FIG. 4, may be coupled to a power supply 844. The voltage regulator 850 may also be configured to provide an output voltage 856, such as the output voltage 114 or the output voltage 216, to the processor 810. The voltage regulator 850 may modify the output voltage 856 based on the activity adjustment signal 854. The voltage regulator 850 may include instructions 852 that are executable by the voltage regulator 850 (e.g., by a processor (not shown) of the voltage regulator 850) to perform one or more functions, such as the method described with reference to FIG. 7.

FIG. 8 shows that the communication device 800 may also include a display controller 826 that is coupled to the processor 810 and to a display device 828. A coder/decoder (CODEC) 834 can also be coupled to the processor 810. A speaker 836 and a microphone 838 can be coupled to the CODEC 834. FIG. 8 also indicates that a wireless controller 840 may be coupled to the processor 810, where the wireless controller 840 is in communication with an antenna 842 via a transceiver 848. The wireless controller 840, the transceiver 848, and the antenna 842 may represent a wireless interface that enables wireless communication by the communication device 800. The communication device 800 may include numerous wireless interfaces, where different wireless networks are configured to support different networking technologies or combinations of networking technologies (e.g., Bluetooth low energy, Near-field communication, cellular, etc.).

In a particular embodiment, the processor 810, the display controller 826, the memory 832, the CODEC 834, the wireless controller 840, the transceiver 848, and the voltage regulator 850 are included in a system-in-package or system-on-chip device 822. In a particular embodiment, an input device 830 and the power supply 844 are coupled to the system-on-chip device 822. Moreover, in a particular embodiment, as illustrated in FIG. 8, the display device 828, the input device 830, the speaker 836, the microphone 838, the antenna 842, and the power supply 844 are external to the system-on-chip device 822. However, each of the display device 828, the input device 830, the speaker 836, the microphone 838, the antenna 842, and the power supply 844 can be coupled to a component of the system-on-chip device 822, such as an interface or a controller.

In conjunction with the described embodiments, an apparatus may include means for receiving, at a voltage regulator, an activity adjustment signal from a digital circuit. For example, the means for receiving may include one or more components (e.g., a circuit) of the voltage regulator 102 of FIG. 1, one or more components (e.g., a circuit) of the voltage regulator 202 of FIG. 2, one or more components (e.g., a circuit) of the voltage regulator 302 of FIG. 3, one or more components (e.g., a circuit) of the voltage regulator 402 of FIG. 4, one or more components (e.g., a circuit) of the voltage regulator 850 of FIG. 8, one or more devices configured to receive a signal, or any combination thereof.

The apparatus may also include means for controlling one or more variable impedance elements of the voltage regulator to modify an output voltage provided to the digital circuit. The output voltage is based at least in part on the activity adjustment signal. For example, the means for controlling may include one or more components (e.g., a processor) of the voltage regulator 102 of FIG. 1, the control logic 108, one or more components (e.g., a processor) of the voltage regulator 202 of FIG. 2, one or more components (e.g., a processor) of the voltage regulator 302 of FIG. 3, one or more components (e.g., a processor) of the voltage regulator 402 of FIG. 4, one or more components (e.g., a processor) of the voltage regulator 850 of FIG. 8, one or more devices configured to control components having variable impedance, or any combination thereof.

One or more of the disclosed embodiments may be implemented in a system or an apparatus that includes a portable music player, a personal digital assistant (PDA), a mobile location data unit, a mobile phone, a cellular phone, a computer, a tablet, a portable digital video player, or a portable computer. Additionally, the system or the apparatus may include a communications device, a fixed location data unit, a set top box, an entertainment unit, a navigation device, a monitor, a computer monitor, a television, a tuner, a radio, a satellite radio, a music player, a digital music player, a video player, a digital video player, a digital video disc (DVD) player, a desktop computer, any other device that stores or retrieves data or computer instructions, or a combination thereof. As another illustrative, non-limiting example, the system or the apparatus may include remote units, such as global positioning system (GPS) enabled devices, navigation devices, fixed location data units such as meter reading equipment, or any other electronic device. Although one or more of FIGS. 1-8 illustrate systems, apparatuses, and/or methods according to the teachings of the disclosure, the disclosure is not limited to these illustrated systems, apparatuses, and/or methods. Embodiments of the disclosure may be suitably employed in any device that includes circuitry.

It should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be employed or that the first element must precede the second element in some manner. Also, unless stated otherwise a set of elements may comprise one or more elements.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

Various illustrative components, blocks, configurations, modules, circuits, and steps have been described above generally in terms of their functionality. Whether such functionality is implemented as hardware or processor executable instructions depends upon the particular application and design constraints imposed on the overall system. Additionally, the various operations of methods described above (e.g., any operation illustrated in one or more of the FIGS. 1-8) may be performed by any suitable means capable of performing the operations, such as various hardware and/or software component(s), circuits, and/or module(s). Skilled artisans may implement the described functionality in varying ways for each particular application, but such implementation decisions should not be interpreted as causing a departure from the scope of the present disclosure.

Those of skill in the art would further appreciate that the various illustrative logical blocks, configurations, modules, circuits, and algorithm steps described in connection with the present disclosure may be implemented or performed with a general purpose processor, a digital signal processor (DSP), an application specific integrated circuit (ASIC), a field programmable gate array (FPGA), a programmable logic device (PLD), discrete gate or transistor logic, discrete hardware components (e.g., electronic hardware), computer software executed by a processor, or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

In one or more aspects, the functions described may be implemented in hardware, software, firmware, or any combination thereof. If implemented in software, the functions may be stored as one or more instructions or code on a computer-readable medium. Computer-readable media includes computer readable storage media and communication media including any medium that facilitates transfer of computer program data from one place to another. A storage media may be any available media that can be accessed by a computer. By way of example, and not limitation, such computer readable storage media can include random access memory (RAM), read-only memory (ROM), programmable read-only memory (PROM), erasable PROM (EPROM), electrically erasable PROM (EEPROM), register(s), hard disk, a removable disk, a compact disc read-only memory (CD-ROM), other optical disk storage, magnetic disk storage, magnetic storage devices, or any other medium that can be used to store program code in the form of instructions or data and that can be accessed by a computer. In the alternative, the computer-readable media (e.g., a storage medium) may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

Also, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), and floppy disk where disks usually reproduce data magnetically, while discs reproduce data optically with lasers. Thus, in some aspects computer readable medium may include a non-transitory computer readable medium (e.g., tangible media). Combinations of the above should also be included within the scope of computer-readable media.

The methods disclosed herein include one or more steps or actions. The method steps and/or actions may be interchanged with one another without departing from the scope of the claims. In other words, unless a specific order of steps or actions is specified, the order and/or use of specific steps and/or actions may be modified without departing from the scope of the disclosure.

Certain aspects may include a computer program product for performing the operations presented herein. For example, a computer program product may include a computer-readable storage medium having instructions stored (and/or encoded) thereon, the instructions being executable by one or more processors to perform the operations described herein. The computer program product may include packaging material.

Further, it should be appreciated that modules and/or other appropriate means for performing the methods and techniques described herein can be downloaded and/or otherwise obtained by a user terminal and/or base station as applicable. Alternatively, various methods described herein can be provided via storage means (e.g., RAM, ROM, or a physical storage medium such as a compact disc (CD)). Moreover, any other suitable technique for providing the methods and techniques described herein can be utilized. It is to be understood that the scope of the disclosure is not limited to the precise configuration and components illustrated above.

The previous description of the disclosed embodiments is provided to enable a person skilled in the art to make or use the disclosed embodiments. While the foregoing is directed to aspects of the present disclosure, other aspects of the disclosure may be devised without departing from the basic scope thereof, and the scope is determined by the claims that follow. Various modifications, changes and variations may be made in the arrangement, operation, and details of the embodiments described herein without departing from the scope of the disclosure or the claims. Thus, the present disclosure is not intended to be limited to the embodiments herein but is to be accorded the widest scope possible consistent with the principles and novel features as defined by the following claims and equivalents thereof.

What is claimed is:

1. An integrated circuit comprising:
 a voltage regulator configured to receive an activity adjustment signal from a digital circuit and to provide an output voltage to the digital circuit, the voltage regulator including:
  a first variable impedance element;
  a second variable impedance element;
  an active device configured to generate a first control signal to control the second variable impedance element; and
  control logic responsive to the activity adjustment signal, the control logic distinct from the active device, wherein the control logic is configured generate a second control signal to control the first variable impedance element, and wherein the output voltage is based at least in part on the first variable impedance element and the second variable impedance element.

2. The integrated circuit of claim 1, wherein the voltage regulator is configured to increase the output voltage in response to a predicted increase in current demand of the digital circuit, the predicted increase indicated by the activity adjustment signal, and wherein the control logic is distinct from the first variable impedance element.

3. The integrated circuit of claim 1, wherein the voltage regulator is comprises a low drop out (LDO) regulator, and wherein the activity adjustment signal includes a plurality of activity adjustment signals.

4. The integrated circuit of claim 1, wherein the activity adjustment signal is configured to indicate a number of threads executed by the digital circuit.

5. The integrated circuit of claim 1, wherein the activity adjustment signal is configured to indicate a number of instructions to be executed during one or more subsequent clock cycles.

6. The integrated circuit of claim 1, wherein the activity adjustment signal is configured to indicate a type of instruction to be executed during one or more subsequent clock cycles.

7. The integrated circuit of claim 1, wherein the activity adjustment signal is configured to indicate receipt of an interrupt.

8. The integrated circuit of claim 1, wherein the activity adjustment signal is configured to indicate a cache miss event.

9. The integrated circuit of claim 1, wherein the activity adjustment signal is configured to indicate arrival of data from a bus.

10. The integrated circuit of claim 1, wherein the digital circuit includes at least one processor.

11. The integrated circuit of claim 1, wherein the control logic is configured to predict a processing activity level of the digital circuit based on the activity adjustment signal.

12. The integrated circuit of claim 1, wherein the voltage regulator is responsive to a clock signal, wherein the clock signal is a phase shifted version of a digital circuit clock signal, and wherein the digital circuit is responsive to the digital circuit clock signal.

13. The integrated circuit of claim 1, wherein the voltage regulator includes a plurality of passive p-type metal-oxide semiconductor field-effect transistors (pMOSFETs), n-type MOSFETS, p-type FinFETs, n-type FinFETs, or any combination thereof.

14. The integrated circuit of claim 1, wherein the voltage regulator includes a switch mode power supply, and wherein the switch mode power supply includes a plurality of passive elements.

15. The integrated circuit of claim 1, wherein the first variable impedance element, the second variable impedance element, or both include one or more resistors.

16. The integrated circuit of claim 1, wherein the active device comprises a voltage comparator.

17. The integrated circuit of claim 1, wherein the first variable impedance element and the second variable impedance element are coupled in parallel to a voltage supply.

18. The integrated circuit of claim 1, wherein the first variable impedance element includes multiple transistors and a passive device.

19. The integrated circuit of claim 1, wherein the voltage regulator is configured to increase the output voltage to reduce a drop of the output voltage associated with an increase in current consumption of the digital circuit.

20. A method comprising:
 receiving, at a voltage regulator, an activity adjustment signal from a digital circuit;
 generating, at control logic that is distinct from the digital circuit, a first control signal to control a digital variable impedance element of the voltage regulator; and
 generating, at an active device that is distinct from the control logic and is distinct from the digital circuit, a second control signal to control an analog variable impedance element of the voltage regulator, wherein an output voltage provided to the digital circuit from the voltage regulator is based at least in part on the digital variable impedance element and the analog variable impedance element of the voltage regulator.

21. The method of claim 20, further comprising varying a resistance of the digital variable impedance element in response to the first control signal.

22. The method of claim 20, further comprising varying a phase of a current that drives the digital variable impedance element in response to the first control signal.

23. The method of claim 20, further comprising varying phases of multiple currents that drive the digital variable impedance element in response to the first control signal.

24. The method of claim 20, further comprising increasing the output voltage in response to the activity adjustment signal indicating a predicted increase in current demand of the digital circuit.

25. The method of claim 20, wherein the activity adjustment signal indicates a number of threads being executed by on the digital circuit, a number of instructions to be executed in one or more subsequent clock cycles, a type of instruction to be executed in one or more subsequent clock cycles, an interrupt signal associated with the digital circuit transitioning from a sleep state to a wake-up state, a cache miss read event, or a combination thereof.

26. The method of claim 20, wherein the activity adjustment signal corresponds to a projected processing activity of the digital circuit during one or more subsequent clock cycles.

27. The method of claim 20, further comprising receiving a clock signal at the voltage regulator, wherein the clock signal is a phase shifted version of a digital circuit clock signal, and wherein the digital circuit is responsive to the digital circuit clock signal.

28. An apparatus comprising:
  means for receiving, at a voltage regulator, an activity adjustment signal from a digital circuit;
  means for generating a first control signal to control a first variable impedance element of the voltage regulator; and
  means for generating a second control signal to control a second variable impedance element of the voltage regulator, the means for generating the second control signal distinct from the means for generating the first control signal, wherein an output voltage provided to the digital circuit from the voltage regulator is based at least in part on the first variable impedance element and the second variable impedance element.

29. A non-transitory computer-readable storage medium storing instructions executable by a computer to perforin operations comprising:
  receiving, at a voltage regulator, an activity adjustment signal from a digital circuit;
  generating, via control logic that is distinct from the digital circuit, a first control signal to control a digital variable impedance element of the voltage regulator; and
  generating, via an active device that is distinct from the control logic and is distinct from the digital circuit, a second control signal to control an analog variable impedance element of the voltage regulator, wherein an output voltage provided to the digital circuit from the voltage regulator is based at least in part on the digital variable impedance element and the analog variable impedance element of the voltage regulator.

* * * * *